United States Patent
Sawai et al.

(10) Patent No.: US 10,348,305 B2
(45) Date of Patent: Jul. 9, 2019

(54) LEVEL SHIFT CIRCUIT

(71) Applicant: SII Semiconductor Corporation, Chiba-shi, Chiba (JP)

(72) Inventors: Hideyuki Sawai, Chiba (JP); Masakazu Sugiura, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/826,047

(22) Filed: Nov. 29, 2017

(65) Prior Publication Data

US 2018/0205378 A1    Jul. 19, 2018

(30) Foreign Application Priority Data

Jan. 17, 2017 (JP) .................... 2017-005908

(51) Int. Cl.
*H03L 5/00* (2006.01)
*H03K 19/0185* (2006.01)
*H03K 19/003* (2006.01)

(52) U.S. Cl.
CPC .......... *H03K 19/018521* (2013.01); *H03K 19/00361* (2013.01)

(58) Field of Classification Search
None
See application file for complete search history.

(56) References Cited

U.S. PATENT DOCUMENTS

| | | | | |
|---|---|---|---|---|
| 5,646,642 A | * | 7/1997 | Maekawa | H03K 3/356017 326/62 |
| 6,268,755 B1 | * | 7/2001 | Summerlin | H03K 19/00361 326/81 |
| 6,617,878 B2 | * | 9/2003 | Brownlow | H03K 3/356113 326/62 |
| 7,196,547 B2 | * | 3/2007 | Kozawa | H03K 3/356113 326/68 |
| 7,196,699 B1 | * | 3/2007 | Kubota | G09G 3/3677 345/100 |
| 7,839,171 B1 | * | 11/2010 | Miles | H03K 3/011 326/63 |
| 9,257,973 B1 | * | 2/2016 | Shay | H03K 3/356104 |
| 2006/0066349 A1 | * | 3/2006 | Murakami | H03K 3/017 326/81 |
| 2006/0097769 A1 | * | 5/2006 | Mizukami | H03K 3/356113 327/333 |
| 2006/0220696 A1 | * | 10/2006 | Katou | H03K 3/35613 327/100 |
| 2006/0261851 A1 | * | 11/2006 | Kim | H03K 3/011 326/81 |
| 2007/0085566 A1 | * | 4/2007 | Koto | H03K 3/356104 326/80 |

(Continued)

FOREIGN PATENT DOCUMENTS

JP    2011-223052 A    11/2011

*Primary Examiner* — Lincoln D Donovan
*Assistant Examiner* — Khareem E Almo
(74) *Attorney, Agent, or Firm* — Brinks Gilson & Lione

(57) ABSTRACT

Provided is a level shift circuit capable of converting a negative voltage level as well as a positive voltage level. The level shift circuit includes a switching transistor between an input transistor and a load, the switching transistor including a gate connected to a voltage source, and an input negative voltage level is converted into a second negative voltage level based on a voltage of the voltage source and a threshold voltage of the switching transistor.

2 Claims, 4 Drawing Sheets

(56) References Cited

U.S. PATENT DOCUMENTS

| | | | | |
|---|---|---|---|---|
| 2008/0191777 A1* | 8/2008 | Lee | H03K 3/012 | 327/333 |
| 2009/0174458 A1* | 7/2009 | Campbell | H03K 3/012 | 327/333 |
| 2009/0261885 A1* | 10/2009 | Wada | G06F 1/24 | 327/333 |
| 2010/0301900 A1* | 12/2010 | Deng | H03K 3/356113 | 326/81 |
| 2011/0128063 A1* | 6/2011 | Fukuda | H03K 3/356113 | 327/333 |
| 2011/0241754 A1 | 10/2011 | Kajino | | |
| 2012/0038611 A1* | 2/2012 | Otani | H03K 3/356165 | 345/211 |
| 2013/0162294 A1* | 6/2013 | Henmi | H03K 19/018507 | 326/80 |
| 2013/0222038 A1* | 8/2013 | Kuge | H03K 19/00369 | 327/333 |
| 2013/0342259 A1* | 12/2013 | Teraguchi | H03K 3/012 | 327/333 |
| 2014/0340136 A1* | 11/2014 | Teplechuk | H03K 3/35613 | 327/333 |
| 2015/0002206 A1* | 1/2015 | Nakamura | G11C 7/1039 | 327/333 |
| 2015/0078096 A1* | 3/2015 | Kawasaki | H03K 3/35613 | 365/185.23 |
| 2016/0094225 A1* | 3/2016 | Lim | H03K 19/017509 | 345/174 |
| 2016/0118985 A1* | 4/2016 | Zhou | H03K 3/356165 | 326/80 |
| 2016/0182023 A1* | 6/2016 | Morris | G11C 11/419 | 365/156 |
| 2017/0012628 A1* | 1/2017 | Blutman | H03K 19/018514 | |
| 2017/0093403 A1* | 3/2017 | Wilson | H03K 19/018528 | |
| 2017/0110585 A1* | 4/2017 | Takahashi | H03K 17/56 | |
| 2017/0126215 A1* | 5/2017 | Crandall | H03K 17/04 | |
| 2017/0126236 A1* | 5/2017 | Gu | H04L 7/0016 | |
| 2017/0338823 A1* | 11/2017 | Reinhold | G01R 19/16585 | |

* cited by examiner

LEVEL SHIFT CIRCUIT

RELATED APPLICATIONS

This application claims priority under 35 U.S.C. § 119 to Japanese Patent Application No. 2017-005908 filed on Jan. 17, 2017, the entire content of which is hereby incorporated by reference.

BACKGROUND OF THE INVENTION

1. Field of the Invention

The present invention relates to a level shift circuit.

2. Description of the Related Art

As a related-art level shift circuit, there has been known a circuit disclosed in Japanese Patent Application Laid-open No. 2011-223052. FIG. 4 is a circuit diagram for illustrating a related-art level shift circuit.

The related-art level shift circuit includes NMOS transistors 401 and 402, PMOS transistors 411 and 412, an inverter 421, an input terminal 441, and an output terminal 431.

An input signal is a signal that changes between a first positive voltage level VDD1 and a negative voltage level VSS. Transistors 401, 402, 411, and 412 are operated with voltages at a second positive voltage level VDD2 and the negative voltage level VSS.

When the input signal input to the input terminal 441 changes from the negative voltage level VSS to the first positive voltage level VDD1, an output signal from the output terminal 431 starts changing toward a low voltage level since the driving force of the transistor 401 exceeds the driving force of the transistor 411. In this case, the transistor 402 is turned off, and the driving force of the transistor 412 is increased. Therefore, the transistor 411 is further subjected to off-control. As a result, the output signal reaches the negative voltage level VSS.

When the input signal changes from the first positive voltage level VDD1 to the negative voltage level VSS, the potential at a gate of the transistor 411 starts changing toward a low voltage level since the driving force of the transistor 402 exceeds the driving force of the transistor 412. In this case, the transistor 401 is turned off, and the driving force of the transistor 411 is increased. Therefore, the transistor 412 is further subjected to off-control. As a result, the output signal reaches the second positive voltage level VDD2.

As described above, in the related-art level shift circuit, it is possible to output the output signal obtained by converting the positive voltage level of the input signal from the first positive voltage level VDD1 to the second positive voltage level VDD2.

The related-art level shift circuit is a level shift circuit configured to convert a signal at a positive voltage level to a signal at a different positive voltage level.

For example, when a signal at a negative voltage level supplied from an external power supply contains an excessive amount of noise, it is desired to deal with the state by converting the negative voltage level to a negative voltage of another stable voltage system.

SUMMARY OF THE INVENTION

The present invention has been made to solve the above-mentioned problem, and it is an object of the present invention to provide a level shift circuit capable of converting a positive voltage level and a negative voltage level.

In order to solve the problem of the related art, according to one embodiment of the present invention, there is provided a level shift circuit including: a first transistor including a gate connected to an input terminal and a source for receiving a signal at a first negative voltage level; a second transistor including a gate connected to a voltage source and a drain connected to a drain of the first transistor; a load arranged between a source of the second transistor and a power supply terminal for receiving a signal at a second positive voltage level; and an output terminal connected to the source of the second transistor, the input terminal being configured to receive a binary voltage signal at a first positive voltage level and the first negative voltage level, the first positive voltage level corresponding to a voltage lower than the second positive voltage level, the output terminal being configured to output a binary voltage signal at the second positive voltage level and a second negative voltage level.

The level shift circuit of the one embodiment of the present invention includes the switching transistor between the input transistor and the load, the switching transistor including the gate connected to the voltage source. Therefore, an input negative voltage level can be converted into a second negative voltage level VSS2 substantially obtained by adding a voltage of a voltage source 140 to a threshold voltage of a switching transistor 121, and hence there is an effect that the negative voltage level is not influenced by noise of a negative voltage power supply.

DETAILED DESCRIPTION OF THE PREFERRED EMBODIMENTS

Now, embodiments of the present invention are described with reference to the drawings.

In the embodiments, the potential at a first positive voltage terminal is a first positive voltage level VDD1, the potential at a second positive voltage terminal is a second positive voltage level VDD2, and the potential at a negative voltage terminal is a first negative voltage level VSS1. Further, an input signal input to an input terminal 101 is a signal that changes between the first positive voltage level VDD1 and the first negative voltage level VSS1, and an output signal output from an output terminal 102 is a signal that changes between the second positive voltage level VDD2 and a second negative voltage level VSS2. The second negative voltage level VSS2 is described in the following embodiments.

First Embodiment

Figure 1:
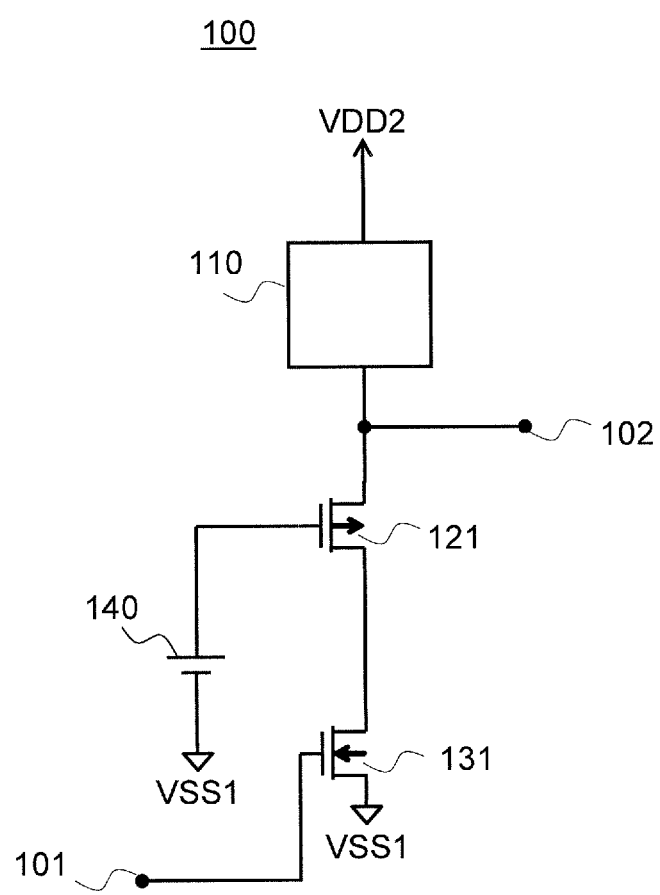
FIG. 1 is a circuit diagram for illustrating a level shift circuit according to a first embodiment of the present invention.

FIG. 1 is a circuit diagram for illustrating a level shift circuit 100 according to a first embodiment of the present invention.

The level shift circuit 100 includes a switching transistor 121 being a PMOS transistor, an NMOS transistor 131, a voltage source 140, a load 110, the input terminal 101, and the output terminal 102.

One terminal of the load 110 is connected to a second positive voltage terminal, and the other terminal of the load 110 is connected to the output terminal 102 and a source of the switching transistor 121. A gate of the switching transistor 121 is connected to one terminal of the voltage source 140, and a drain of the switching transistor 121 is connected to a drain of the NMOS transistor 131. A gate of the NMOS transistor 131 is connected to the input terminal 101, and a source of the NMOS transistor 131 is connected to a negative voltage terminal. The other terminal of the voltage source 140 is connected to the negative voltage terminal.

First, a case of applying, as the input signal, the first positive voltage level VDD1 to the input terminal 101 is considered. A signal at the first positive voltage level VDD1 is applied to the gate of the NMOS transistor 131 to turn on the NMOS transistor 131. A current controlled with the NMOS transistor 131 drives the load 110 via the switching transistor 121. When the current controlled by the NMOS transistor 131 increases, a voltage drop at the load 110 increases. The potential at the source of the switching transistor 121 decreases to reduce a potential difference between the gate and the source of the switching transistor 121, and hence the switching transistor 121 is gradually turned off. Thus, the output terminal 102 outputs a signal at the second negative voltage level VSS2 substantially obtained by adding a voltage of the voltage source 140 to a threshold voltage of the switching transistor 121.

Next, a case of applying, as the input signal, the first negative voltage level VSS1 to the input terminal 101 is considered. A signal at the first negative voltage level VSS1 is applied to the gate of the NMOS transistor 131 to turn off the NMOS transistor 131. The switching transistor 121 is turned on, but a current flowing through the load 110 reaches a local minimum. Thus, a voltage drop in the load 110 is eliminated, and the output terminal 102 outputs the second positive voltage level VDD2.

As described above, with the level shift circuit 100 according to the first embodiment, the negative voltage level can be converted into the second negative voltage level VSS2 substantially obtained by adding the voltage of the voltage source 140 to the threshold voltage of the switching transistor 121, and hence there is an effect that the negative voltage level is not influenced by noise of a negative voltage power supply.

The voltage source 140 is described as a voltage source that is based on the first negative voltage level VSS1. However, as long as a desired second negative voltage level VSS2 is obtained, for example, a voltage source that is based on the second positive voltage level VDD2 may be used.

Further, the switching transistor 121 may be an enhancement type transistor or a depletion type transistor. When the switching transistor 121 is a depletion type transistor, the negative voltage level of the output signal can be set to be equal to or less than the voltage at the gate of the switching transistor 121. Therefore, the potential difference of the output signal can be increased without applying the second positive voltage level VDD2 on a large scale.

Further, the load 110 may be a resistor or a transistor.

Second Embodiment

When the load 110 is formed of a transistor, a positive feedback operation can be implemented, for example, by controlling an impedance value. Thus, the operation speed of the level shift circuit can be increased.

Figure 2:
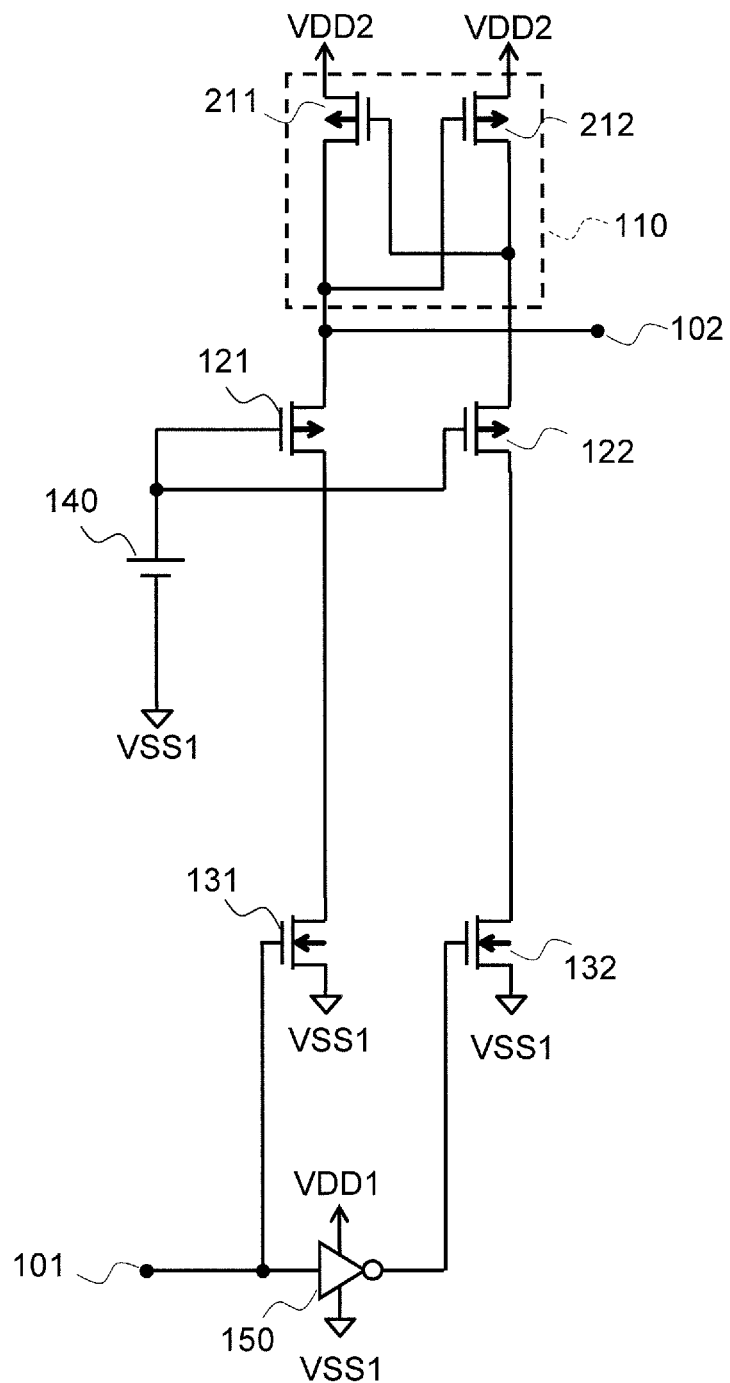
FIG. 2 is a circuit diagram for illustrating a level shift circuit according to a second embodiment of the present invention.

FIG. 2 is a circuit diagram for illustrating a level shift circuit 200 according to a second embodiment of the present invention.

The level shift circuit 200 includes switching transistors 121 and 122, PMOS transistors 211 and 212, NMOS transistors 131 and 132, the voltage source 140, an inverter 150, the input terminal 101, and the output terminal 102. The PMOS transistors 211 and 212 form the load 110.

A gate of the PMOS transistor 211 is connected to a drain of the PMOS transistor 212. A source of the PMOS transistor 211 is connected to the second positive voltage terminal. A drain of the PMOS transistor 211 is connected to a gate of the PMOS transistor 212. The gate of the PMOS transistor 212 is connected to the drain of the PMOS transistor 211. A source of the PMOS transistor 212 is connected to the second positive voltage terminal. The drain of the PMOS transistor 212 is connected to the gate of the PMOS transistor 211. The gate of the switching transistor 121 is connected to one terminal of the voltage source 140. The source of the switching transistor 121 is connected to the drain of the PMOS transistor 211. The drain of the switching transistor 121 is connected to the drain of the NMOS transistor 131. A gate of a switching transistor 122 is connected to one terminal of the voltage source 140. A source of the switching transistor 122 is connected to the drain of the PMOS transistor 212. A drain of the switching transistor 122 is connected to a drain of the NMOS transistor 132. The gate of the NMOS transistor 131 is connected to the input terminal 101, and the source of the NMOS transistor 131 is connected to the negative voltage terminal. A gate of the NMOS transistor 132 is connected to the input terminal 101 through intermediation of the inverter 150, and a source of the NMOS transistor 132 is connected to the negative voltage terminal. The inverter 150 is operated with voltages at the first positive voltage level VDD1 and the first negative voltage level VSS1.

First, the case of applying, as the input signal, the first positive voltage level VDD1 to the input terminal 101 is considered. When the input signal input to the input terminal 101 changes from the first negative voltage level VSS1 to the first positive voltage level VDD1, an output signal from the output terminal 102 starts changing toward a low voltage level since the driving force of the NMOS transistor 131 exceeds the driving force of the PMOS transistor 211. In this case, the NMOS transistor 132 is turned off, and the driving force of the PMOS transistor 212 is increased. Therefore, the PMOS transistor 211 is further subjected to off-control. As a result, the potential at the source of the switching transistor 121 decreases to reduce a potential difference between the gate and the source of the switching transistor 121, and hence the switching transistor 121 is gradually turned off. Thus, the output terminal 102 outputs a signal at the second negative voltage level VSS2 substantially obtained by adding the voltage of the voltage source 140 to the threshold voltage of the switching transistor 121.

Next, the case of applying, as the input signal, the first negative voltage level VSS1 to the input terminal 101 is considered. When the input signal changes from the first positive voltage level VDD1 to the first negative voltage level VSS1, the potential at the gate of the PMOS transistor 211 starts changing toward a low voltage level since the driving force of the NMOS transistor 132 exceeds the driving force of the PMOS transistor 212. In this case, the NMOS transistor 131 is turned off, and the driving force of the PMOS transistor 211 is increased. Therefore, the PMOS transistor 212 is further subjected to off-control. Thus, the PMOS transistor 211 is turned on, and hence the output terminal 102 outputs a signal at the second positive voltage level VDD2.

The gate of the PMOS transistor 211 is connected to the drain of the PMOS transistor 212, and the gate of the PMOS transistor 212 is connected to the drain of the PMOS transistor 211. Therefore, a positive feedback operation can be implemented by flexibly controlling the impedance values thereof. Specifically, when the NMOS transistor 131 is about to change to an ON state, the PMOS transistor 211 is about to change to an OFF state. Therefore, the output signal from the output terminal 102 quickly reaches the second negative voltage level VSS2. Further, when the NMOS transistor 131 is about to change to an OFF state, the PMOS transistor 211 is about to change to an ON state. Therefore, the output signal from the output terminal 102 quickly reaches the second positive voltage level VDD2.

As described above, with the level shift circuit 200 according to the second embodiment, the negative voltage level can be converted into the second negative voltage level VSS2 substantially obtained by adding the voltage of the voltage source 140 to the threshold voltage of the switching transistor 121, and hence there is an effect that the negative voltage level is not influenced by noise of the negative voltage power supply. Further, there is also an effect that a conversion speed is increased.

In the above description, the output terminal 102 is described as the source of the switching transistor 121, but the output terminal 102 may be the source of the switching transistor 122 instead.

Further, the switching transistor 121 may be an enhancement type transistor or a depletion type transistor. When the switching transistor 121 is a depletion type transistor, the negative voltage level of the output signal can be set to be equal to or less than the voltage at the gate of the switching transistor 121. Therefore, the potential difference of the output signal can be increased without applying the second positive voltage level VDD2 on a large scale.

Third Embodiment

Figure 3:
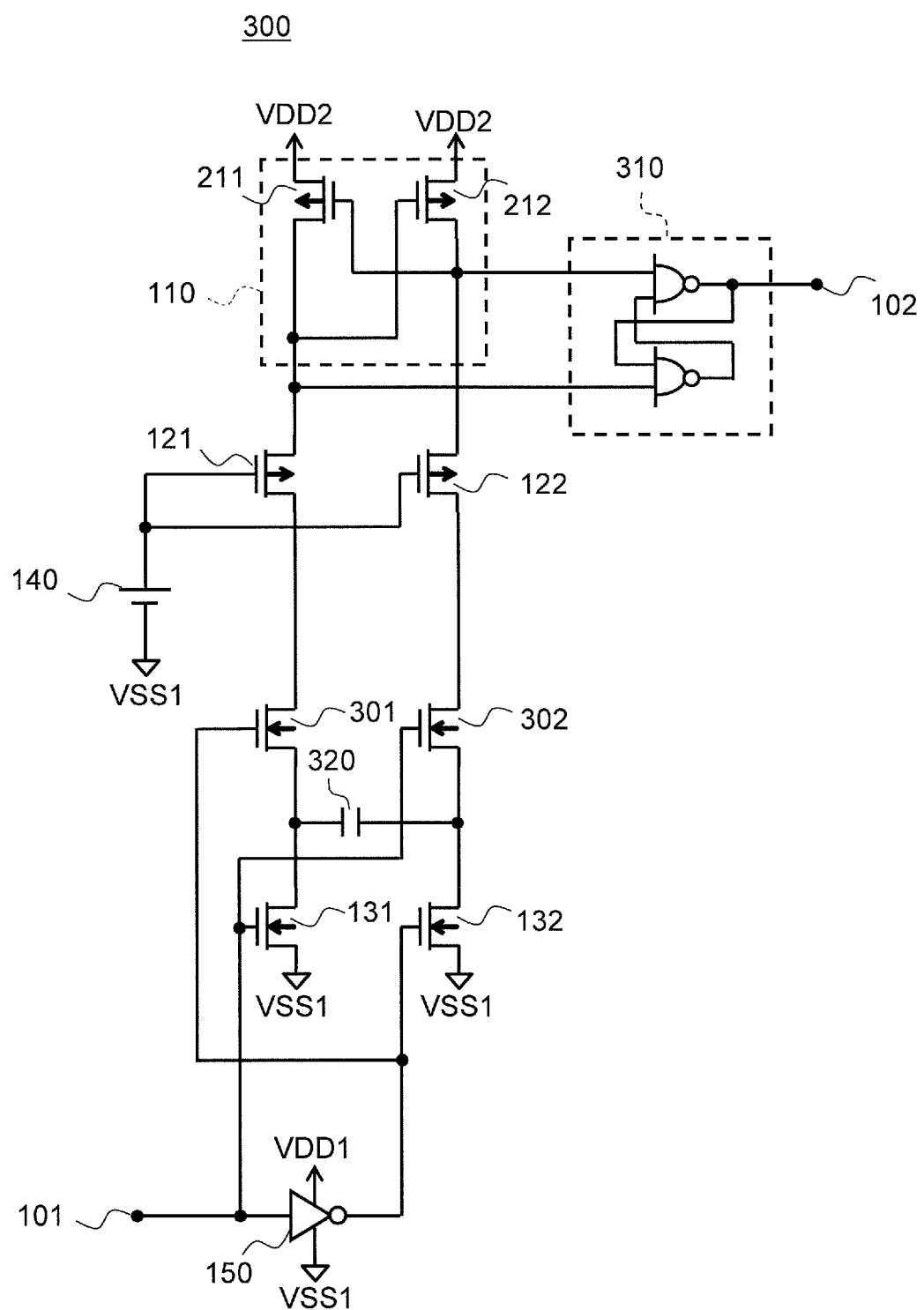
FIG. 3 is a circuit diagram for illustrating a level shift circuit according to a third embodiment of the present invention.
Figure 4:
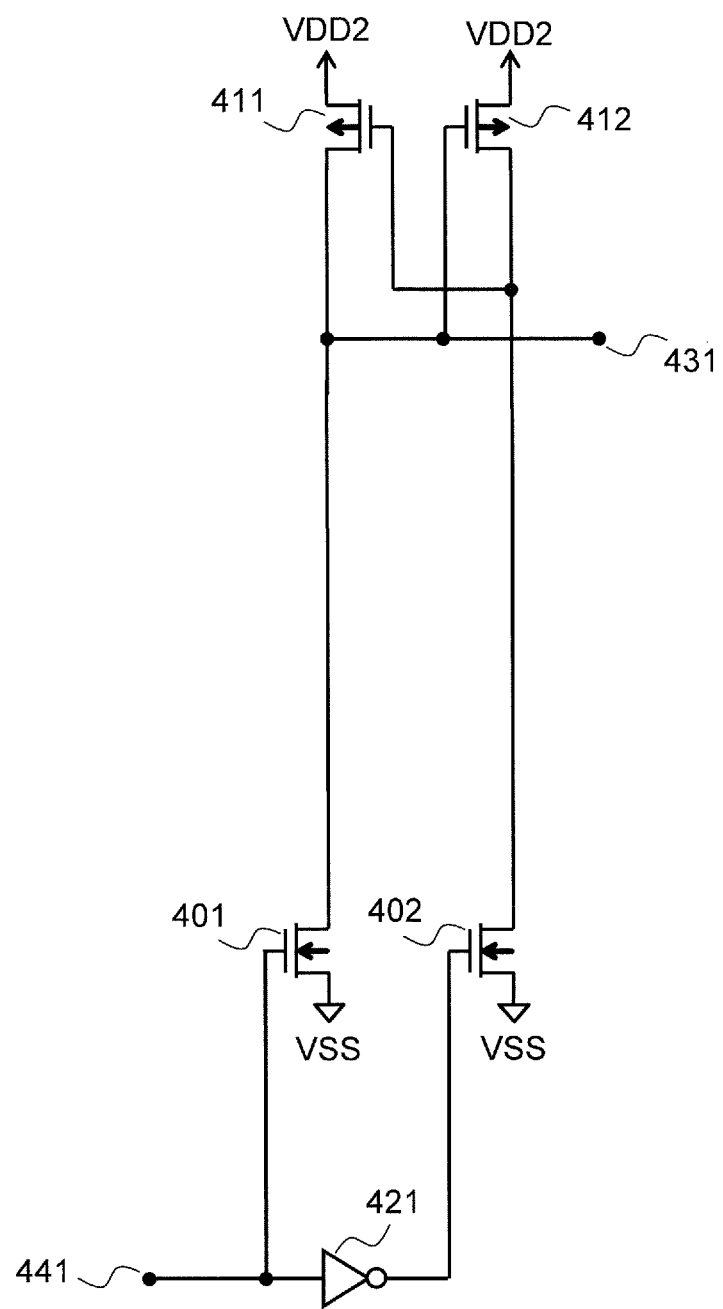
FIG. 4 is a circuit diagram for illustrating a related-art level shift circuit.

FIG. 3 is a circuit diagram for illustrating a level shift circuit 300 according to a third embodiment of the present invention.

The level shift circuit 300 includes NMOS transistors 301 and 302, a latch circuit 310, and a capacitor 320 in addition to the components of the level shift circuit 200. The other configurations are the same as those of the level shift circuit 200. Therefore, like components are denoted by like reference symbols, and overlapping description of the same part is appropriately omitted.

A source of the NMOS transistor 301 is connected to the drain of the NMOS transistor 131. A drain of the NMOS transistor 301 is connected to a drain of the switching transistor 121. A gate of the NMOS transistor 301 is connected to an output terminal of the inverter 150. A source of the NMOS transistor 302 is connected to the drain of the NMOS transistor 132. A drain of the NMOS transistor 302 is connected to a drain of the switching transistor 122. A gate of the NMOS transistor 302 is connected to the input terminal 101.

Two input terminals of the latch circuit 310 are connected to the drains of the PMOS transistors 211 and 212, respectively, and an output terminal of the latch circuit 310 is connected to the output terminal 102. The latch circuit 310 is operated with the voltage at the second positive voltage level VDD2 and the voltage of the voltage source 140, and is configured to shape and output a rectangular wave through use of transition of the input signals as a trigger.

The capacitor 320 is connected between the source of the NMOS transistor 301 and the source of the NMOS transistor 302.

The capacitor 320 is charged with electric charges when the NMOS transistors 131 and 302 are in an ON state or when the NMOS transistors 132 and 301 are in an ON state. For example, when the NMOS transistors 131 and 302 are turned on, the voltage at the source of the switching transistor 122 rapidly drops. Then, the voltage at the source of the switching transistor 122 increases at a rate determined based on a current value of the PMOS transistor 212 and a capacitance value of the capacitor 320. Therefore, the voltages at the sources of the switching transistors 121 and 122 rapidly drop in a moment in accordance with the input signal of the input terminal 101. Then, the latch circuit 310 shapes and outputs the rectangular wave accordingly. The rectangular wave output from the latch circuit 310 becomes a rectangular wave based on the second positive voltage level VDD2 and the voltage of the voltage source 140.

In this case, also in the level shift circuit 300 further including the NMOS transistors 301 and 302, the capacitor 320, and the latch circuit 310, the effects obtained by arranging the switching transistors 121 and 122 and the voltage source 140 can be attained.

The latch circuit 310 only needs to have a function of shaping and outputting a rectangular wave through use of transition of the input signals as a trigger, and the mode thereof is not limited to the circuit of FIG. 3.

As described above, with the level shift circuit 300 according to the third embodiment, the negative voltage level can be converted into the second negative voltage level VSS2 substantially obtained by adding the voltage of the voltage source 140 to the threshold voltage of the switching transistor 121, and hence there is an effect that the negative voltage level is not influenced by noise of the negative voltage power supply. Further, there is also an effect that the conversion speed is increased.

The switching transistors 121 and 122 being PMOS transistors each include an N-type well region as a back gate, which is connected to the source in many cases. In this case, a leakage current flows toward a P-type substrate region having a VSS potential during high-temperature operation, and hence the potentials at the sources of the switching transistors 121 and 121 may significantly decrease. In this circumstance, there is a risk in that the potential difference between the gate and the source of each of the switching transistors 121 and 122 may excessively increase to exceed a withstand voltage. In order to avoid such risk, a clamping element configured to clamp a voltage may be arranged between the gate and the source of each of the switching transistors 121 and 122.

As described above, the level shift circuit of the present invention can convert the negative voltage level as well as the positive voltage level, and hence there is an effect that the negative voltage level is not influenced by noise of the negative voltage power supply.

What is claimed is:
1. A level shift circuit comprising:
   a first transistor including a gate connected to an input terminal and a source that receives a signal at a first negative voltage level;
   a second transistor including a gate connected to a voltage source and a drain connected to a drain of the first transistor;

a load between a source of the second transistor and a power supply terminal that receives a signal at a second positive voltage level;

an output terminal connected to the source of the second transistor, the input terminal configured to receive a binary voltage signal at a first positive voltage level and the first negative voltage level, the first positive voltage level corresponding to a voltage lower than the second positive voltage level, the output terminal configured to output a binary voltage signal at the second positive voltage level and a second negative voltage level, wherein the second negative voltage level comprises a sum of a voltage of the voltage source and a threshold voltage of the second transistor;

a third transistor including a gate connected to the input terminal via an inverter and a source that receives the first negative voltage level;

a fourth transistor including a gate connected to the voltage source, a drain connected to a drain of the third transistor, and a source connected to the load;

a fifth transistor between the first transistor and the second transistor, and includes a gate connected to the input terminal through intermediation of the inverter;

a sixth transistor between the third transistor and the fourth transistor, and includes a gate connected to the input terminal;

a capacitor between the drain of the first transistor and the drain of the third transistor; and a latch circuit between the load and the output terminal.

2. A level shift circuit according to claim 1, wherein each of the second transistor and the fourth transistor comprises a clamping element between the gate and the source of the each of the second transistor and the fourth transistor.

* * * * *